United States Patent [19]

Sekine et al.

[11] Patent Number: 4,838,978
[45] Date of Patent: Jun. 13, 1989

[54] DRY ETCHING APPARATUS

[75] Inventors: Makoto Sekine, Yokohama; Haruo Okano, Tokyo; Tsunetoshi Arikado, Tokyo; Yasuhiro Horiike, Tokyo, all of Japan

[73] Assignee: Kabushiki Kaisha Toshiba, Kawasaki, Japan

[21] Appl. No.: 123,353

[22] Filed: Nov. 20, 1987

[30] Foreign Application Priority Data

Nov. 21, 1986 [JP] Japan .................. 61-277984

[51] Int. Cl.⁴ ............................................. C23F 1/02
[52] U.S. Cl. .................................. 156/345; 156/643; 427/47; 118/723; 118/729; 118/501; 118/623
[58] Field of Search ............. 156/345, 643; 427/47; 118/723, 729, 50.1, 623

[56] References Cited

U.S. PATENT DOCUMENTS

| | | | |
|---|---|---|---|
| 4,119,688 | 10/1978 | Hiraoka | 156/345 |
| 4,209,357 | 6/1980 | Gorin et al. | 156/345 |
| 4,318,767 | 3/1982 | Hijikata et al. | 156/345 |
| 4,361,106 | 12/1982 | Nakazato et al. | 156/345 |
| 4,483,737 | 11/1984 | Mantei | 156/345 |
| 4,492,610 | 1/1985 | Okano et al. | 156/345 |
| 4,526,643 | 7/1985 | Okano et al. | 156/345 |
| 4,547,247 | 10/1985 | Warenbach et al. | 156/345 |
| 4,585,920 | 4/1986 | Hoog et al. | 156/345 |
| 4,657,619 | 4/1987 | O'Donnell | 156/345 |

FOREIGN PATENT DOCUMENTS 57-41100 9/1982 Japan .

OTHER PUBLICATIONS

Tegal 1500: Rie/Plasma Production Series.

Primary Examiner—Kenneth M. Schor
Assistant Examiner—L. Johnson
Attorney, Agent, or Firm—Oblon, Spivak, McClelland, Maier & Neustadt

[57] ABSTRACT

A dry etching apparatus which includes an anode located at an upper side and a cathode located at a lower side which face each other in a vacuum vessel. A high-frequency power can be applied across the anode and the cathode. A flange section extends from the inner wall of the vacuum vessel, and is located between the anode and the cathode. A semiconductor wafer can be placed on the cathode through a tray. The cathode is moved toward the anode together with the tray and the wafer. When the edge portion of the tray abuts against the flange section, the interior of the vacuum vessel is partitioned into an etching chamber and the other chamber. A magnetic field is applied to the etching chamber from outside the vacuum vessel, and an etching gas is also introduced into the etching chamber. When the etching gas is introduced, the interior of the etching chamber is evacuated to be maintained at a predetermined pressure.

13 Claims, 4 Drawing Sheets

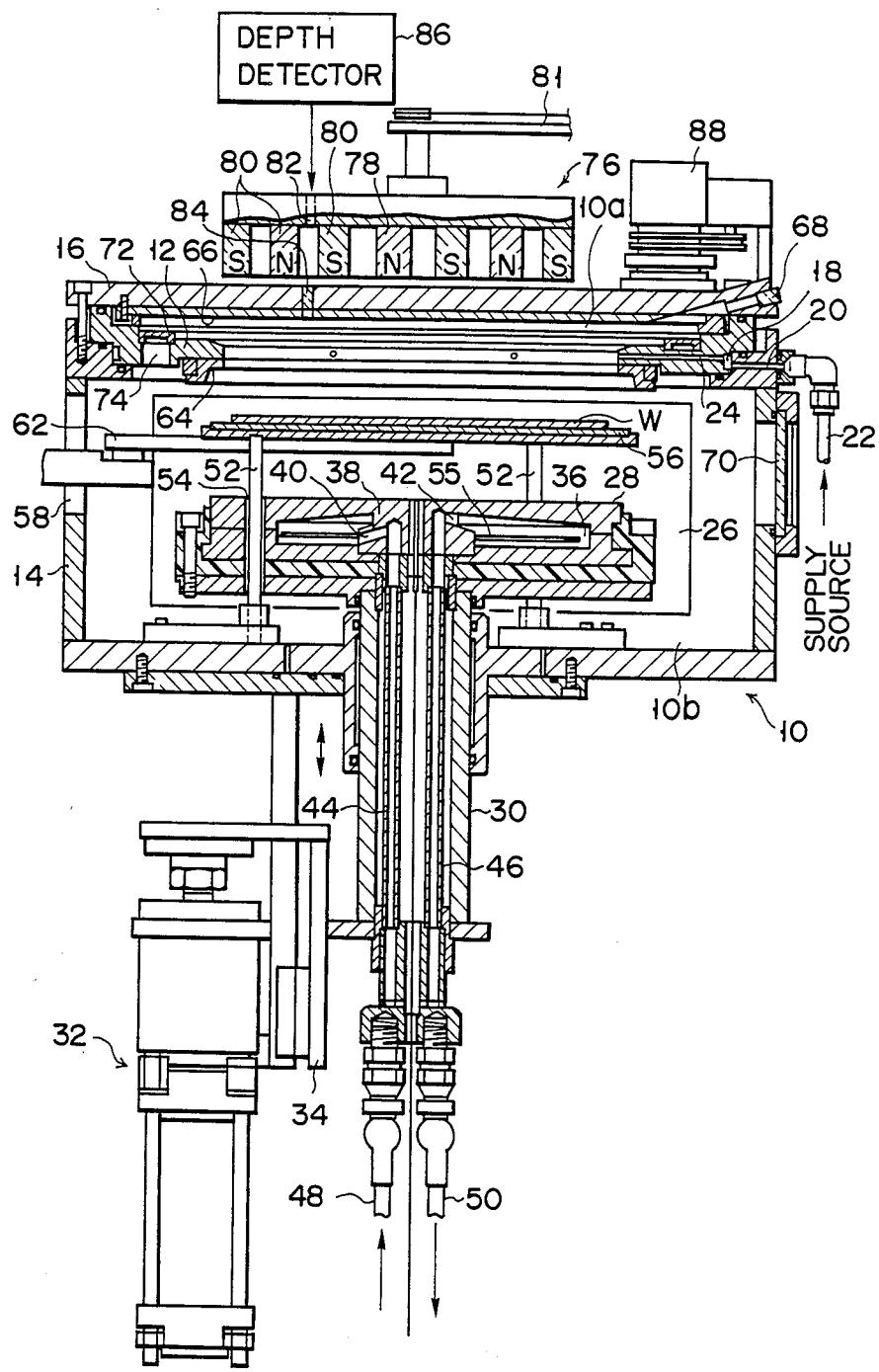
F I G. 1

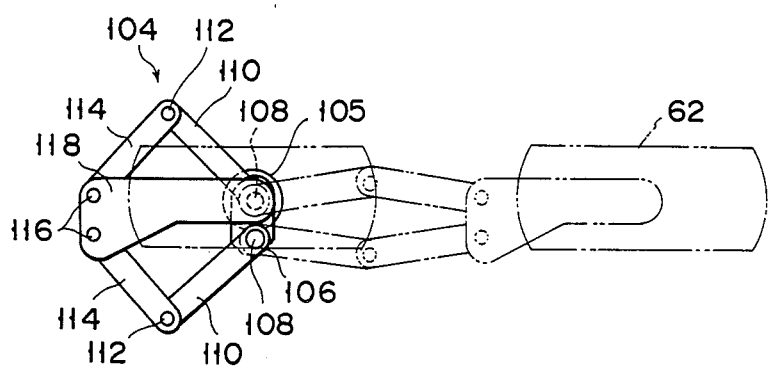
FIG. 5
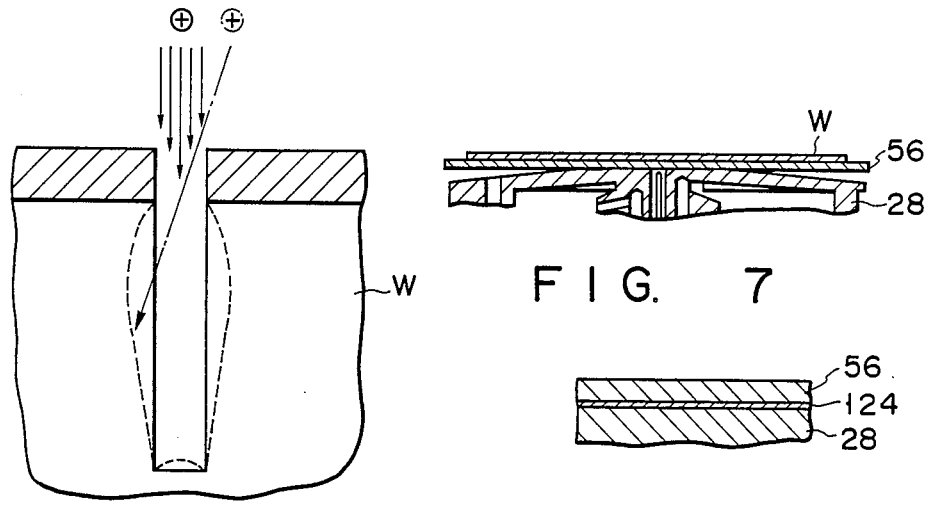
FIG. 6
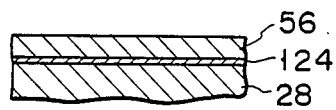
FIG. 7
FIG. 8
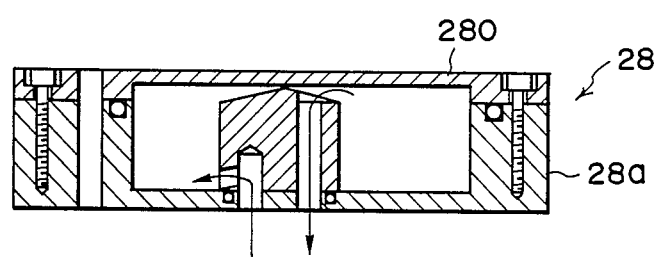
FIG. 9

DRY ETCHING APPARATUS

BACKGROUND OF THE INVENTION

1. Field of the Invention

The present invention relates to a dry etching apparatus for performing dry etching of a workpiece such as a semiconductor wafer and, more particularly, to a dry etching apparatus utilizing magnetron discharging.

2. Discussion of the Background

In recent years, a manufacturing technique of semiconductor integrated circuits has been developed, and a semiconductor integrated circuit incorporating individual elements having a size on the order of submicrons, i.e., an LSI (large scale integrated circuit), has recently been manufactured on an experimental basis. In recent studies of manufacturing techniques of LSIs, a large number of trenches are formed in a silicon substrate, and an insulating material is buried therein to isolate individual elements, or after a thin oxide film is formed on the inner surface of each trench, a conductor serving as an electrode is buried in the trench to form a capacitor of a MOS (metal oxide semiconductor) structure.

When an LSI is manufactured using the above-mentioned techniques, deep trenches having a small opening width, i.e., having a large aspect ratio (depth of trench/opening width) must be formed in a silicon substrate.

After a silicon oxide (SiO$_2$) film as a mask is formed on a silicon substrate, trenches having a large aspect ratio are formed by reactive ion etching (RIE). However, in the conventional RIE, an etching speed is very slow, i.e., about 0.1 m/min, and becomes slower as the opening width of the trench becomes smaller.

In the trench formed by the conventional RIE, a portion of the inner wall surface near the opening is scooped out, and another portion of the inner wall surface near the bottom portion is etched to be a tapered surface. Thus, it is difficult to form a straight inner wall surface of the trench. The reason why the etched portion or the tapered surface is formed is that a large number of reactive ions obliquely bombard the masked surface of the silicon wafer.

Furthermore, in the conventional RIE, high-energy reactive ions are radiated onto a silicon wafer. Elements already formed on the silicon wafer are damaged by the reactive ions.

SUMMARY OF THE INVENTION

It is an object of the present invention to provide a dry etching apparatus which can form trenches having a large aspect ratio in a workpiece to be etched, can precisely control the shape of each trench, and can prevent the workpiece from undesirable damage during processing of the trenches.

The above object can be achieved by a dry etching apparatus according to the present invention. The dry etching apparatus comprises a vacuum vessel. In the vacuum vessel, a first electrode and a second electrode located therebelow are arranged to face each other, and high-frequency power can be supplied across the first and second electrodes.

A flange section extends from the inner wall of the vacuum vessel to be located between the first and second electrodes. A workpiece can be loaded between the flange section and the second electrode from outside the vacuum vessel.

The second electrode is moved together with the workpiece toward the first electrode by a drive means. Thus, an edge portion of the second electrode is urged against the flange section. When the edge portion of the second electrode is urged against the flange section, it partitions the interior of the vacuum vessel into an etching chamber in which the workpiece is stored.

An etching gas is introduced into the etching chamber by an introduction means. The introduction means comprises a plurality of supply holes, formed in the flange section at predetermined intervals in the circumferential direction, for supplying the etching gas toward the etching chamber.

Means for applying a magnetic field inside the etching chamber is arranged outside the vacuum vessel, and a plasma is generated in the etching chamber by the high-frequency power applied across the first and second electrodes.

The interior of the etching chamber is vacuumed by a vacuum means. Thus, the pressure inside the etching chamber is maintained at a predetermined pressure capable of continuously generating a plasma.

According to the dry etching apparatus of the present invention described above, the etching chamber is defined under the condition that the first electrode is close to the second electrode. Therefore, the volume of the etching chamber can be reduced as compared to the total volume of the vacuum vessel. In addition, since a magnetic field is applied to the etching chamber, magnetron discharge is induced inside the etching chamber so that a high-density plasma is produced inside the etching chamber. As a result, an etching speed of the workpiece can be increased by the high-density plasma.

Since the interior of the etching chamber is maintained at a predetermined pressure, scattering of ions from the plasma can be effectively suppressed. As a result, most of ions from the plasma are vertically radiated onto the workpiece. Therefore, an etching trench can be accurately formed in the workpiece.

Furthermore, since the magnetic field is applied to the plasma, the energy of ions radiated from the plasma to the workpiece can be reduced. Therefore, unnecessary damage to the workpiece can be prevented.

A more complete appreciation of the invention and many of the attendant advantages thereof will be readily obtained as the same becomes better understood by reference to the following detailed description when considered in connection with the accompanying drawings, wherein:

BRIEF DESCRIPTION OF THE DRAWINGS

FIG. 1 is a sectional view showing a vacuum vessel of a dry etching apparatus according to an embodiment of the present invention;

FIG. 5 is a plan view of a stretching mechanism used for transferring a tray;

FIG. 6 is a view showing a trench formed in a wafer by etching; and

FIGS. 7 to 9 are sectional views showing modifications of the present invention.

DESCRIPTION OF THE PREFERRED EMBODIMENTS

Figures 2, 3:
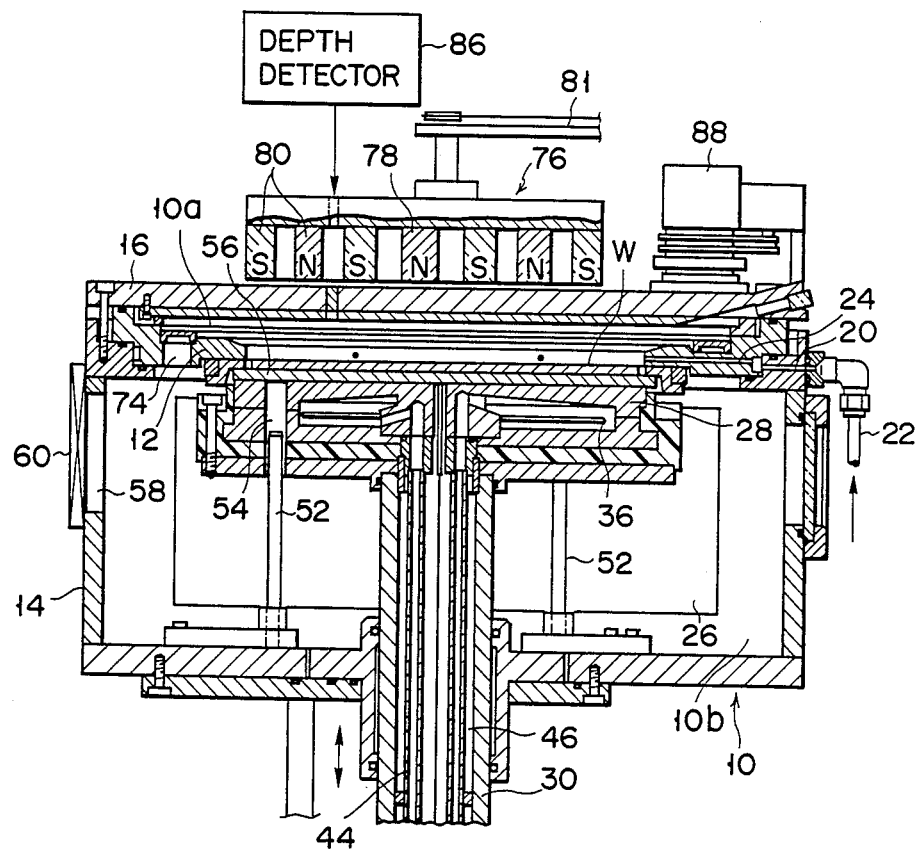
FIG. 2 is a sectional view partially showing a tray holding a semiconductor wafer in the dry etching apparatus.
FIG. 3 is a sectional view showing an etching state in the vacuum vessel shown in FIG. 1.

A dry etching apparatus shown in FIG. 1 comprises vacuum vessel 10 is formed of a conductive material, which has a box shape as a whole. Vacuum vessel 10 is grounded.

Flange section 12 extend from the inner wall of vessel 10, and is clamped between vessel body 14 and ceiling plate 16 of vessel 10. A predetermined space is defined between flange section 12 and ceiling plate 16.

As shown in FIG. 1, annular passage 18 is defined between the outer circumferencial surface of flange section 12 and vessel body 14. Annular passage 18 is connected to gas supply pipe 22 through passage 20 in vessel body 14. Gas supply pipe 22 is connected to an etching gas supply source (not shown). Annular passage 18 is further connected to a plurality of gas introduction holes 24. Holes 24 are formed at predetermined intervals along the circumferential direction of flange section 12, and are open to the inner circumferential surface of flange section 12.

Exhaust port 26 is open to one side wall of vessel body 14 of vacuum vessel 10. Port 26 is connected to an oil-free type vacuum pump (not shown) such as a turbo molecular drag pump.

Cathode 28 is arranged in vacuum vessel 10. Cathode 28 is arranged to face the ceiling plate of vacuum vessel 10 as anode 16. The area of anode 16 is set to be 5 times or less that of cathode 28.

Predetermined high-frequency power from a high-frequency power source (not shown) is applied across cathode 28.

Cathode 28 has a disk shape, and is coupled to the upper end of lifting pipe 30. Lifting pipe 30 airtightly extends downward through the bottom wall of vessel 10 and can move in an upward or downward direction.

The lower end of liftingpipe 30 is coupled to movable member 34 of lifting cylinder 32. Therefore, when lifting cylinder 32 is driven, cathode 28 can be moved vertically.

Annular cooling chamber 36 having cylindrical portion 38 at its center is defined in cathode 28. Inlet hole 40 open to the bottom portion of cooling chamber 36 and outlet hole 42 are formed in cylindrical portion 38 of cathode 28.

Inlet and outlet holes 40 and 42 are respectively connected to inlet pipe 44 and outlet pipe 46. These inlet and outlet pipes 44 and 46 extend inside lift pipe 30, as shown in FIG. 1, and project therefrom. The projecting ends of inlet and outlet pipes 44 and 46 are respectively connected to inlet and outlet hoses 48 and 50. Inlet hose 48 is connected to a cooling water supply source (not shown), and outlet hose 50 is connected to a reservoir of the supply source. Therefore, cooling water is circulated between cooling chamber 36 in cathode 28 and the supply source of the cooling water, thereby cooling cathode 28. Note that disk 55 may be arranged in cooling chamber 36 in order to promote substitution of cooling water in chamber 36 if necessary, as shown in FIG. 1.

Four support rods 52 are arranged in vacuum vessel 10. Each support rod 52 projects upward from the bottom surface of vessel 10, and extends through corresponding through hole 54 formed in cathode 28 when cathode 28 is located at the position shown in FIG. 1. It should be noted that through holes 54 of cathode 28 are arranged outside cooling chamber 36.

Tray 56 holding semiconductor wafer W as a work piece can be placed on cathode 28. Tray 56 is formed of a conductive metal material. A thin dielectric film 56a comprising a kapton film, a Mylar film, etc., is formed on the upper surface of tray 56, as shown in FIG. 2. Wafer W is electrostatically chucked on tray 56 by applying a DC voltage across wafer W and tray 56. As a matter of course, a mask having a predetermined pattern (not shown) is preformed on a surface to be etched of wafer W, i.e., the upper surface of wafer W. In order to electrostatically chuck wafer W on tray 56, a pair of dielectric films sandwiching a metal foil therebetween may be arranged between wafer W and tray 56, and a high voltage may be applied across the metal foil and tray 56.

Tray 56 holding wafer W is loaded inside vacuum vessel 10 by transfer arm 62. When cathode 28 is located at the position shown in FIG. 1, tray 56 is placed on four support rods 52. Transfer arm 62 will be described later in detail.

Transfer arm 62 and tray 56 holding wafer W are loaded inside vessel 10 through loading hole 58 open to the side wall of vessel body 14. Loading hole 58 can be opened/closed by gate valve 60 (FIG. 2).

After transfer arm 62 loads tray 56 holding wafer W inside vessel 10, it is escapes outside vessel 10 through loading hole 58, and thereafter, loading hole 58 is closed by gate valve 60.

While tray 56 holding wafer W is placed on four support rods 52, when cathode 28 is moved upward by lifting cylinder 32, cathode 28 abuts against the lower surface of tray 56 and pushes up tray 56 together with wafer W. Thus, the edge portion of tray 56 is brought into contact with insulating ring 64 mounted on the lower surface of flange section 12, as shown in FIG. 3. In this manner, tray 56 is mechanically chucked between insulating ring 64 and cathode 28, and at this time, the upward movement of cathode 28 is stopped.

When cathode 28 is moved upward and the edge portion of tray 56 is brought into contact with flange section 12, i.e., insulating ring 64 as described above, the interior of vacuum vessel 10 is partitioned into etching chamber 10a of wafer W and loading chamber 10b. It should be noted that whenever a wafer W is in etching chamber 10a, no wafers W are provided in loading chamber 10b.

Protective plate 66 made of a quartz plate is adhered to the upper surface of etching chamber 10a, i.e., the lower surface of anode 16. As shown in FIG. 1, observation window 68 for monitoring the interior of etching chamber 10a is provided to anode 16, while observation window 70 for monitoring the interior of loading chamber 10b is provided an vessel body 14.

Exhaust ring 72 is mounted on the upper surface of flange section 12. A plurality of communication holes 74 are formed in exhaust ring 72 and flange section 12 at predetermined intervals in the circumferential direction. Thus, etching chamber 10a and loading chamber 10b normally communicate with each other through communication holes 74.

Magnet assembly 76 is arranged above vacuum vessel 10 and near anode 16. Magnet assembly 76 comprises a base, cylindrical center magnet 78 fixed to the base, and a plurality of ring magnets 80 which are concentrically fixed at predetermined intervals to the base to have center magnet 78 at the center. The circular end face of center magnet 78 facing anode 16 is magnetized to have, e.g., an N polarity, and the annular end faces of ring magnets 80 facing anode 16 are magnetized to have different polarities from that of adjacent ring magnet 80 or center magnet 78, as shown in FIG. 1. A gap between magnet assembly 76 and anode 16 is set to fall within the range of 1 to 10 cm.

Magnet assembly 76 described above is rotatably suspended from support arm 81. A rotational axis of magnet assembly 76 is deviated from the axis of center magnet 78 by a predetermined distance, as is apparent from FIG. 1. Therefore, center magnet 78 and ring magnets 80 are eccentrically rotated upon rotation of entire magnet assembly 76.

Vertical through hole 82 is formed in magnet assembly 76. When magnet assembly 76 is located at the position illustrated in FIG. 1, through hole 82 is aligned with light guide window 84 provided to anode 16 and protective plate 66. Light emitted from optical depth detector 86 arranged above assembly 76 is incident into through hole 82. The light incident in through hole 82 is radiated onto wafer W on tray 56 through ring magnets 80 and light guide window 84. At the same time, the light reflected by wafer W is incident on depth detector 86 along a path opposite to that described above.

Figure 4:
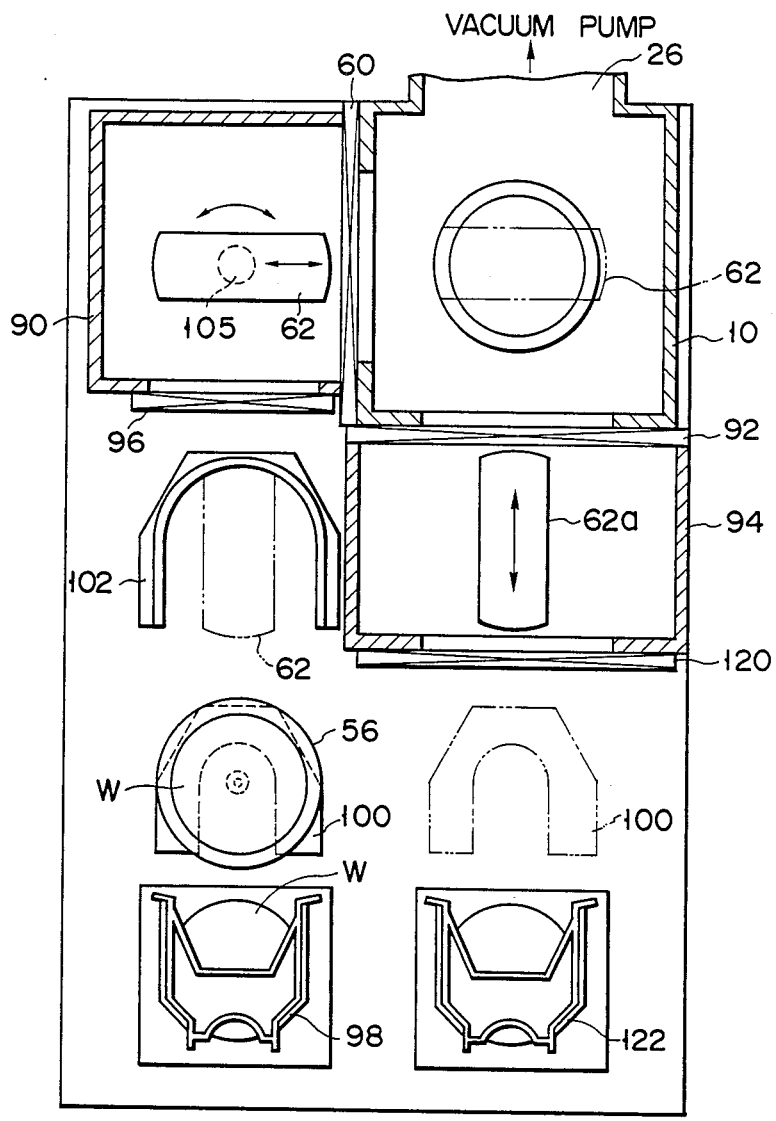
FIG. 4 is a schematic view of the entire dry etching apparatus.

FIG. 4 schematically shows the entire dry etching apparatus including vacuum vessel 10 described above.

First auxiliary vessel 90 is arranged adjacent to vacuum vessel 10, and can communicate therewith through gate valve 60 described above. The interior of first auxiliary vessel 90 can be evacuated to a vacuum pressure by a vacuum pump (not shown). Second auxiliary vessel 94 is arranged at the side wall side of vacuum vessel 10 facing exhaust port 26, and can communicate with chamber 10 through gate valve 92 similar to gate valve 60. Nitrogen gas can be supplied into second auxiliary vessel 94 from a gas supply source (not shown).

Gate valve 96 is arranged on the side wall of first auxiliary vessel 90. Loading carrier 98 is arranged outside first auxiliary vessel 90 to face gate valve 96. Carrier 98 stores a predetermined number of wafers W to be etched.

One wafer W is picked up from carrier 98 by a pickup mechanism (not shown), and is placed on tray 56 on movable table 100 placed near carrier 98. Tray 56 on which wafer W is placed is moved together with movable table 100 to electrostatic chuck station 102 arranged between first auxiliary vessel 90 and carrier 98. Movement of tray 56, i.e., movement of table 100 is performed by a moving mechanism (not shown).

Wafer W is electrostatically chucked by tray 56 on electrostatic chuck station 102.

Transfer arm 62 described above is arranged in first auxiliary vessel 90. Transfer arm 62 has an elongated shape capable of being inserted between support rods 52 of vacuum vessel 10.

Transfer arm 62 is coupled to stretching mechanism 104 shown in FIG. 5. Stretching mechanism 104 comprises rotatable and vertically movable post 105. Table 106 is mounted on the upper end of post 105. A pair of rotational shafts 108 project upward from table 106, and are rotated in opposite directions. Each rotational shaft 108 is coupled to the proximal end of corresponding first link 110. The distal end of each first link 110 is coupled to the proximal end of corresponding second link 114 through pin 112. The distal ends of these second links 114 are coupled to arm base 118 through pins 116. Arm base 118 is joined to the lower surface of transfer arm 62.

With stretching mechanism 104 described above, the pair of rotational shafts 108 are rotated in the opposite directions, so that arm base 118, i.e., transfer arm 62 can be moved from a reference position indicated by solid lines in FIG. 5 to an extended position indicated by imaginary lines through the pair of first links 110 and the pair of second links 114, and vice versa.

Therefore, transfer arm 62 in first auxiliary vessel 90 is rotated through 90 degrees from the state shown in FIG. 4. After gate valve 96 is opened, transfer arm 62 projects from first auxiliary vessel 90 upon operation of stretching mechanism 104. Transfer arm 62 which projects as described above is positioned at station 102 as indicated by imaginary lines in FIG. 4, and tray 56 holding wafer W is placed on transfer arm 62. Thereafter, transfer arm 62 is returned inside first auxiliary vessel 90 together with tray 56 holding wafer W, and is positioned, as shown in FIG. 4. Thereafter, the interior of first auxiliary vessel 90 is evacuated to a vacuum pressure.

When the interior of vessel 90 is evacuated to a vacuum pressure, the interior of vacuum vessel 10 is also evacuated to a vacuum pressure at the same time. Thus, the interiors of chambers 90 and 10 are maintained at substantially the same vacuum pressure. In this state, when gate valve 60 which shuts off communication between vessels 90 and 10 is opened, transfer arm 62 is inserted into vessel 10, as shown in FIG. 1, thereby loading tray 56 holding wafer W into vessel 10. Cathode 28 in vessel 10 is located at its lowermost position in this state, as shown in FIG. 1.

Thereafter, transfer arm 62 is moved downward by a predetermined distance, and tray 56 holding wafer W is placed on four support rods 52. Transfer arm 62 is returned into first auxiliary vessel 90 through open gate valve 60. Then, gate valve 60 is closed to separate vessels 90 and 10 from each other.

Cathode 28 is then moved upward to a position shown in FIG. 3, and the interior of vessel 10 is partitioned into etching chamber 10a and loading chamber 10b, as described above.

In this state, an etching gas (in this embodiment, chlorine gas) is introduced from an etching gas supply source into etching chamber 10a at a predetermined flow rate through pipe 22 and holes 24. The chlorine gas introduced into etching chamber 10a flows out to loading chamber 10b through communication holes 74 formed in flange section 12 and exhaust ring 72, and is exhausted from loading chamber 10b through exhaust port 26 by the vacuum pump. The vacuum pump has an evacuation capacity sufficient to maintain the pressure inside etching chamber 10a to be $3 \times 10^{-3}$ Torr when the chlorine gas is introduced into etching chamber 10a at a flow rate of 60 cc/min.

Furthermore, the cooling medium is supplied into cooling chamber 36 in cathode 28 as described above. Therefore, wafer W is cooled through cathode 28 and tray 56, and the temperature of wafer W is controlled to be a predetermined value.

Thereafter, a high-frequency power is applied across anode 16 and cathode 28, and at the same time, glow starter 88 is operated, thus generating a plasma inside etching chamber 10a. Since a magnetic field generated from magnet assembly 76 is applied to the interior of etching chamber 10a, a high-density plasma can be generated in chamber 10a. As a result, a large number of ions are radiated onto wafer W from the plasma, and wafer W can be etched at a high etching speed (in the case of a silicon wafer, the etching speed is 0.7 μm/min).

Since the plasma in chamber 10a is induced at a low pressure (about $10^{-3}$ Torr), this means the free path of ions from the plasma is long. Therefore, scattering of ions radiated from the plasma toward wafer W can be eliminated. As a result, most of ions from the plasma are vertically radiated on wafer W. Thus, as indicated by an alternate long and short dashed line in FIG. 6, the number of ions obliquely radiated onto wafer W can be greatly reduced. The side walls of a trench formed by etching will not be scooped out as indicated by dotted curves in FIG. 6, and the side walls of this trench can be vertical walls as indicated by solid lines.

As can be seen from the above description, since the pressure inside etching chamber 10a is maintained at a low pressure, the number of neutral atoms and molecules in etching chamber 10a is very small. For this reason, when wafer W is formed of aluminum or phosphorus-doped polycrystalline silicon, the etched trench is undercut due to the presence of neutral particles described above. However, in the dry etching apparatus of the present invention, undercutting described above can be prevented. Therefore, according to the dry etching apparatus of the present invention, trenches having vertical side walls can be formed by etching in wafer W formed of aluminum or phosphorus-doped polycrystalline silicon.

Since the magnetic field is applied to the plasma, as described above, the energy of ions bombarding the etching surface of wafer W from the plasma is reduced, and damage to wafer W, i.e., damage causing a degradation in characteristics of electrical elements already formed on wafer W, can be prevented. Thus, highly reliable LSIs can be manufactured.

Since center magnet 78 and ring magnets 80 in magnet assembly 76 are eccentrically rotated, the etching depth of wafer W can be uniformed.

In the dry etching apparatus of the present invention, vacuum vessel 10 can be partitioned into etching chamber 10a and loading chamber 10b when etching is performed, thus greatly reducing the volume of etching chamber 10a. In addition, the distance between cathode 28 and magnet assembly 76 can be reduced to several cm. As a result, the plasma induced in etching chamber 10a can be effectively utilized, and etching efficiency can be improved. Since the volume of etching chamber 10a is small, an amount of an etching gas to be supplied to etching chamber 10a, i.e., chlorine gas, can be reduced.

Since protective plate 66 formed of a quartz plate is mounted on the inner surface of anode 16 in vessel 10, the inner surface of anode 16 is not exposed to the high-density plasma. As a result, metal particles, etc., will not be sputtered from the inner surface of anode 16 and wafer W will not be contaminated with metal particles.

The state of etching can be monitored using optical depth detector 86. More specifically, depth detector 86 emits light toward wafer W, and receives light reflected by wafer W so as to detect an etching depth of wafer W. Since magnet assembly 76 is rotated, the measurement of the etching depth is performed when through hole 82 of magnet assembly 76 and light guide window 84 are aligned with each other.

Upon completion of etching, introduction of the chlorine gas into etching chamber 10a is stopped, and the interior of vacuum chamber 10 is again evacuated to a predetermined vacuum pressure. Thereafter, cathode 28 is moved downward to the position illustrated in FIG. 1, and tray 56 holding wafer W is placed on four support rods 52. At the same time, gate valve 92 disconnecting vessels 10 and 94 is opened.

As shown in FIG. 4, transfer arm 62a similar to transfer arm 62 and a stretching mechanism are arranged in second auxiliary vessel 94. Tray 56 holding wafer W is transferred from vessel 10 to vessel 94 by transfer arm 62a. After gate valve 92 is closed, nitrogen gas is introduced into second auxiliary vessel 94, and the interior of vessel 94 is pressurized to the atmospheric pressure. Gate valve 120 of vessel 94 (FIG. 4) is opened, and wafer W in vessel 94 is picked up from vessel 94 together with tray 56. Then, wafer W is placed on movable table 100 (indicated by imaginary lines in FIG. 4) positioned near vessel 94. Wafer W on table 100 is returned to unloading carrier 122 by a mechanism (not shown). Meanwhile, tray 56 is positioned in front of loading carrier 98 together with table 100.

A plurality of trays 56 are used for etching of wafers W. When one wafer W is etched in vessel 10, next wafer W can stand by in first auxiliary vessel 90. Meanwhile, already etched wafer W can be unloaded from vessel 10 into second auxiliary vessel 94. As a result, wafers W can be successively etched, and an etching time for a large number of wafers W can be shortened.

The present invention is not limited to the above embodiment. In an embodiment shown in FIG. 7, the upper surface of cathode 28 is arcuated to be part of a sphere. In this manner, when cathode 28 is moved upward, tray 56 is brought into contact with flange section 12 through insulating ring 64, and is clamped between insulating ring 64 and cathode 28, tray 56 is arcuated along the upper surface of cathode 28. As a result, contact properties between cathode 28 and tray 56 can be improved, and wafer W can be efficiently cooled. In FIG. 7, the arcuated upper surface of cathode 28 is exaggerated. However, in practice, the upper surface of cathode 28 is arcuated to have a difference of only about 1 mm between its central and edge portions. Tray 56 may be arcuated in place of the upper surface of cathode 28.

In an embodiment illustrated in FIG. 8, thin synthetic resin film 124 having good heat conductivity and elasticity is formed on one of the lower surface of tray 56 and the upper surface of cathode 28. In this case, wafer W can be efficiently cooled.

Tray 56 is formed of a conductive metal material as described above. In consideration of a heat capacity and conduction of heat, tray 56 is preferably formed of aluminum, etc., having good heat conductivity. The thickness of tray 56 is preferably small, e.g., 2 to 3 mm if tray 56 is arcuated before use or is arcuated upon etching. However, if flat tray 56 is used, it preferably has a large thickness.

According to an embodiment shown in FIG. 9, cathode 28 is constituted by body 28a having cooling chamber 36, and upper cover 28b for liquid-tightly closing cooling chamber 36. Upper cover 28b is detachably mounted on body 28a by bolts. In this manner, since upper cover 28b of cathode 28 which is most easily degraded can be detachably arranged, only upper cover 28b can be replaced.

Magnet assembly 76 is not limited to cylindrical or ring-shaped magnets described above but may employ rod-like magnets. In this case, the rod-like magnets extend parallel to the upper surface of anode 16 and are arranged at predetermined intervals in the horizontal direction. The end faces of the rod-like magnets facing anode 16 are magnetized to have different polarities from those of adjacent magnets. The rod-like magnets can be synchronously reciprocated in the horizontal direction. All the magnets described above are assumed to be permanent magnets. Of course, electromagnets may be used in place of the permanent magnets.

According to the dry etching apparatus of the present invention, at the same time of introduction of the etching gas, another gas for forming a deposition layer on wafer W can be introduced into etching chamber 10a, so that the side walls of etched trenches can be tapered.

In the embodiments described above, the wafer is mounted on the tray and transferred into the vacuum vessel. Instead, the wafer can be directly mounted on the transfer arm and transferred into the vacuum vessel as the arm rotates and then expands. If this is the case, etching chamber 10a is formed when cathode 28 is pressed onto flange section 12, and only the wafer, not both the wafer and tray 56, is placed within etching chamber 10a.

Obviously, numerous modifications and variations of the present invention are possible in light of the above teachings. It is therefore to be understood that within the scope of the appended claims, the invention may be practiced otherwise than as specifically described herein.

What is claimed is:

1. A dry etching apparatus for etching a workpiece, comprising:
   a vacuum vessel having a loading chamber;
   an anode and a cathode which are arranged to face each other in said vacuum vessel;
   high-frequency power means for being applied to said cathode;
   a flange section extending from an inner wall of said vacuum vessel and located between said anode and said cathode;
   loading means for loading a workpiece into said loading chamber between said flange section and said cathode from outside said vacuum vessel;
   drive means for moving said cathode together with the workpiece toward said anode and urging an edge portion of said cathode against said flange section, said cathode partitioning an interior of said vacuum vessel into an etching chamber in which the workpiece is stored when the edge portion of said cathode is urged against said flange section;
   means for introducing an etching gas into said etching chamber, said introducing means including at least one supply hole, formed in said flange section, for supplying the etching gas toward said etching chamber;
   means for applying a magnetic field into said etching chamber, so that a plasma is generated in said etching chamber by the magnetic field and the high-frequency power applied to said cathode, said means for applying a magnetic field including a magnetic unit which is positioned outside said vacuum vessel such that said anode is located between said magnetic unit and said cathode; and
   evacuation means for evacuating the interior of said etching chamber to maintain a predetermined pressure in said etching chamber, said evacuation means including a plurality of exhaust holes formed in said flange section at predetermined intervals in a circumferential direction and opening to a surface of said flange section faces said etching chamber, said exhaust holes communicating with said etching chamber and said loading chamber of said vacuum vessel.

2. An apparatus according to claim 1, wherein said loading means includes a tray loaded into said vacuum vessel for holding the workpiece placed on said tray.

3. An apparatus according to claim 2, further comprising means for moving said cathode; toward said anode in order to partition said vacuum vessel into said etching chamber.

4. An apparatus according to claim 3, wherein one of said cathode and said tray has an arcuately shaped supporting surface.

5. An apparatus according to claim 3, which further comprises a thin film having elasticity and good heat conductivity adhered to said tray.

6. An apparatus according to claim 1, wherein said loading means includes first and second auxiliary vessels which communicate with said vacuum vessel through gate valves, and transfer means for transferring the workpiece from said first auxiliary vessel into said vacuum vessel and from said vacuum vessel into said second auxiliary vessel.

7. An apparatus according to claim 1, wherein said magnetic unit includes a plurality of rod-like or ring-shaped magnet members which are arranged so that magnetic poles adjacent to said anode are alternately arranged along said anode, and including means for parallely reciprocating or eccentrically rotating said magnet members.

8. An apparatus according to claim 1, wherein when said etching chamber is defined in said vacuum vessel, a distance between said anode and cathode is set to fall within a range of 1 to 10 cm.

9. An apparatus according to claim 8, wherein said anode comprises a part of said vacuum vessel.

10. An apparatus according to claim 9, wherein an area of said anode is not more than 5 times that of said cathode.

11. An apparatus according to claim 10, wherein said cathode comprises a body, and a cover portion detachably mounted to said body and facing said anode.

12. An apparatus according to claim 1, wherein said evacuation means has an evacuation capacity of not more than $3 \times 10^{-3}$ Torr when the etching gas is introduced into said etching chamber at a flow rate of 60 cc/min.

13. An apparatus according to claim 1, wherein said introduction means includes a plurality of supply holes formed in said flange section at given intervals in a circumferential direction.

* * * * *